United States Patent [19]
Ibe

[11] Patent Number: 5,135,727
[45] Date of Patent: Aug. 4, 1992

[54] AUTOMATIC SINGLE CRYSTAL INGOT DISCONNECTOR FOR SINGLE CRYSTAL PULLING APPARATUS

[75] Inventor: Hiroyuki Ibe, Fukui, Japan

[73] Assignee: Shin-Etsu Handotai Co., Ltd., Tokyo, Japan

[21] Appl. No.: 800,307

[22] Filed: Nov. 29, 1991

[30] Foreign Application Priority Data

Nov. 29, 1990 [JP] Japan ............................ 2-325571

[51] Int. Cl.$^5$ ............................................. B01D 9/00
[52] U.S. Cl. ................................. 422/249; 65/174;
83/73; 83/112; 83/288; 83/289; 125/23.01;
125/24; 125/901; 156/601; 156/617.1;
156/DIG. 65
[58] Field of Search ............. 65/174; 83/73, 112,
83/288, 289, 374, 385; 156/601, 617.1, DIG. 65;
422/249; 125/23.01, 24, 901

[56] References Cited

U.S. PATENT DOCUMENTS

| | | | |
|---|---|---|---|
| 702,014 | 6/1902 | Lubbers | 156/617.1 |
| 921,861 | 5/1909 | Matthiessen | 83/385 |
| 2,876,147 | 3/1959 | Kniepkamp et al. | 422/249 |
| 2,893,847 | 7/1959 | Schweickert et al. | 422/249 |
| 3,372,003 | 3/1968 | Yamase | 422/249 |
| 3,589,884 | 6/1971 | Guiriec | 65/174 |
| 4,834,062 | 5/1989 | Frank et al. | 125/23.01 |
| 4,852,304 | 8/1989 | Honda et al. | 125/23.01 |

*Primary Examiner*—Robert Kunemund
*Assistant Examiner*—Felisa Garrett
*Attorney, Agent, or Firm*—Lowe, Price, LeBlanc & Becker

[57] ABSTRACT

An automatic single crystal ingot disconnector which is mounted on the uppermost chuck of the conventional single crystal ingot removing assembly, which uppermost chuck assembly is adapted to shift in the axial direction of the ingot being chucked; the proposed single crystal ingot disconnector includes: (a) a neck clamper for clamping the neck of the single crystal ingot, (b) a neck cutter for cutting through the neck of the ingot to thereby disconnect the ingot from the seed crystal to which the ingot is connected, and (c) a TV camera to view the position where the neck cutter applies a cutting operation on the neck of the ingot.

5 Claims, 3 Drawing Sheets

AUTOMATIC SINGLE CRYSTAL INGOT DISCONNECTOR FOR SINGLE CRYSTAL PULLING APPARATUS

BACKGROUND OF THE INVENTION

The present invention relates to an automatic single crystal ingot disconnector to be remote-controlled and used with a single crystal pulling apparatus, or more particularly to such a disconnector which is operated by remote controlling to automatically sever a single crystal ingot at the neck which ingot is pulled up in the single crystal pulling apparatus.

Single crystal materials such as single crystal silicon can be obtained, for instance, by the Czochralski (CZ) method, which utilizes a single crystal pulling apparatus, which is an apparatus for growing and pulling up a single crystal ingot from a molten liquid of a polycrystal substance. This apparatus comprises a main chamber wherein the single crystal is grown, and in this main chamber are housed a crucible for containing polycrystal substance, a heater arranged to surround the crucible, and a heat insulator arranged to surround the heater. Beneath the main chamber are provided mechanisms for rotating the crucible to control the uniformity of the heat flux in the melt during the crystal growing process. Rising above the main chamber is a towering structure of a crystal pull chamber which is an upright, substantially cylindrical enclosure terminating in an upper structure of a crystal pulling mechanism. The single crystal ingot which is grown and raised high in the main chamber is brought up into the pull chamber.

In the single crystal pulling apparatus, the single crystal is caused to grow from the lower tip of a seed crystal which is attached to the lower end of a pull device such as a wire. As the seed crystal is rotated and brought up higher slowly, the single crystal is grown longer from the seed tip and an extremely thin needle-like portion (hereinafter referred to as a "neck") is firstly formed, and the diameter of the single crystal gets larger as the length of the the single crystal increases until the diameter becomes a predetermined size. In order to remove the thus grown crystal ingot from the single crystal pulling apparatus, it is necessary to disconnect the ingot from the pull device at the neck.

Problems the Invention seeks to solve

However, removing single crystal ingots from the crystal pulling apparatus has in the past presented problems. Typically, the operator, in removing a grown ingot, severs the ingot at the neck with a tool such as a pair of nippers and actually carries the ingot through the access door. Since the ingot is raised high at the end of the pulling operation, to nip the neck of the ingot is not without a danger. Furthermore, as technology progresses toward ever larger ingots, the weight of the grown ingot, as well as its residual elevated temperature at the time of its removal, makes such manual removal a less than desirable operation.

Also, so long as this removal operation is conducted manually, it is not possible to fully automatize the total operation of the single crystal pulling apparatus, that is, to automatically conduct the complete operation series which starts with charging of the polycrystal substance and ends with removal of the single crystal ingot after it is pulled up.

The present invention was motivated in view of these problems, and, therefore, it is an object of the invention to provide an automatic single crystal ingot disconnector for a single crystal pulling apparatus which disconnector is remote-controlled and automatically disconnects a single crystal ingot at the neck thereof so that it becomes possible to disconnect the fully grown ingot without human hands and thus safely, and hence a full automatization of the single crystal pulling apparatus is attained.

SUMMARY OF THE INVENTION

Means to solve the Problems

In order to attain the above objects and other, the present inventor proposes an automatic single crystal ingot disconnector which is mounted fixedly on the uppermost chuck assembly of the conventional single crystal ingot removing assembly (hereinafter described in detail), which uppermost chuck assembly is adapted to shift in the axial direction of the ingot being chucked in response to remote controlling; the proposed automatic single crystal ingot disconnector is constructed to include a neck clamper means for clamping an upper part of the neck portion of the single crystal ingot, a neck cutter means located below the neck clamper means, for cutting through the neck portion of the single crystal ingot at a part lower than the said upper part to thereby disconnect the single crystal ingot from the seed crystal to which the ingot is connected, and a monitor means for visually monitoring a position where the neck cutter means applies a cutting operation on the neck portion of the single crystal ingot.

In a preferred embodiment of the invention, the neck clamper means includes two clamp fingers which cooperate to assume an open position and a clamping (closed) position by horizontally swinging through an angle of about 90°, and an actuator means for driving the clamp fingers in response to remote controlling.

More preferably, the neck cutter means comprises a sharp cutter blade adapted to swing horizontally through an angle of about 90° and an actuator means for driving the cutter blade in response to remote controlling.

Furthermore, it is preferred also, that the monitor means comprises a TV camera adapted to view the position where the neck cutter means applies a cutting operation on the neck of the single crystal ingot, and a viewing screen located at a remote place from the single crystal ingot disconnector for reproducing the picture of the scene viewed by the TV camera.

Result of the Invention

Consequently, it is now possible to disconnect the grown single crystal ingot at the neck automatically and by remote controlling; thus, the operation of the single crystal pulling apparatus includes no dangerous manual task and is in condition to be fully automatized.

BRIEF DESCRIPTION OF THE DRAWINGS

These and other effects of the invention will be realized by reference to the description, taken in connection with the accompanying drawings, in which.

EMBODIMENT

Figure 1:
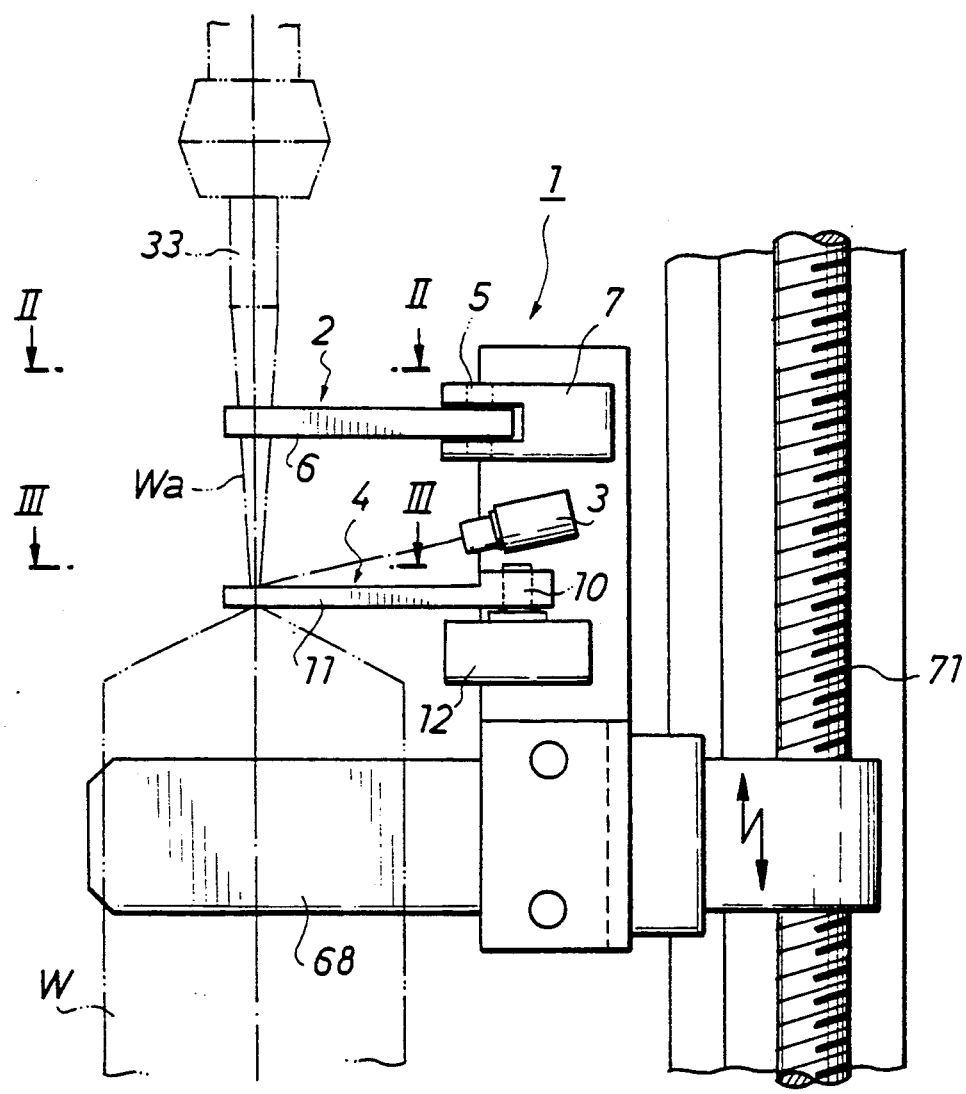
FIG. 1 is a side view of an automatic single crystal ingot disconnector incorporated in a single crystal pulling apparatus of the invention.

An embodiment of the invention shall be described with reference to the attached drawings.

Firstly, with reference to FIG. 4, the basic construction of a single crystal pulling apparatus 30, designed in accordance with the invention, will be described. The single crystal pulling apparatus 30 has a main chamber 31 and a crystal pull chamber 32, both made of stainless steel, and the latter 32 provided above and in coaxial alignment with the former 31. A quartz crucible, a heater, an insulator, etc., not shown, are housed in the main chamber 31. This single crystal pulling apparatus 30 is adapted to grow and pull up a single crystal ingot W in accordance with the CZ method. Accordingly, a polycrystal substance such as silicon is charged in the crucible installed in the main chamber 31 and heated and melted by the heater; then, in this polycrystal molten liquid is dipped a seed crystal 33 fixed at the lower end of a pull means such as a wire, not shown, which is suspended from above, and the desired single crystal ingot W grows from the seed crystal 33 as the pull means is rotated and raised at predetermined rates together with the seed crystal 33. The thus grown single crystal ingot W is pulled up higher and eventually received in the pull chamber 32.

Next, the construction of the single crystal ingot removing assembly will be described.

Vertical support posts 40 are firmly installed in the vicinity of the single crystal pulling apparatus 30, and a single crystal ingot removing assembly 50, which is provided independently of the pulling apparatus 30, is attached to one of the support posts 40 in a manner such that the ingot removing assembly 50 is capable of vertically shifting along the support post 40.

More particularly, the vertical support post 40 is provided with a pair of vertical guide rails 52, 52 fixed thereon, and the ingot removing assembly 50 includes a vertically shiftable base 51, which is provided with a plurality of sliders 53, which 53 are slidably engaged with the guide rails 52, 52, so that the base 51 is capable of shifting vertically along the support post 40. This vertically shiftable base 51 is attached to and suspended by a chain 55 uncoiled and hanging from an electric chain block 54 which is hooked to a horizontal beam 41 mounted on the flush tops of the support posts 40, 40.

The vertically shiftable base 55 is provided with a pair of laterally extending guide rails fixed thereon, and the ingot removing assembly 50 further includes a laterally shiftable base 56, which is provided with a plurality of sliders which are slidably engaged with the laterally extending guide rails of the base 55, so that the base 56 is capable of shifting laterally in parallel with the vertically shiftable base 55. Thus, the ingot removing assembly 50 is capable of shifting both vertically and laterally.

A first arm 59 has its base portion pivotally hinged on the laterally shiftable base 56 by means of the vertical shaft pins 60, 60. Thus, the first arm 59 is capable of swinging horizontally about the shaft pins 60, 60. This first arm 59 is adapted to swing through a maximum angle of 90° by means of a drive mechanism which is driven by an electric motor, not shown. Incidentally, the laterally shiftable base 56 is shifted by means of a rack-and-pinion mechanism which is driven by an electric motor, not shown either.

A second arm 61 has its base portion pivotally hinged on the fore portion of the first arm 59, and is provided with a bracket 63 at the lower end. A swing arm 64 is hinged at its lower end on the bracket 63 by means of a horizontal shaft 65. Incidentally, the second arm 61 is adapted to swing horizontally through a maximum angle of 180° by means of a drive mechanism which is driven by an electric motor, not shown, and the swing arm 64 is adapted to swing vertically about the shaft 65, and has its upper end tethered to an electric chain block 66 supported at the upper end of the first arm 59, by way of a chain 67 uncoiled from the chain block 66. The vertical swinging of the swing arm 64 is governed by the coiling and uncoiling of the chain 67 which is effects as the chain block 66 is rotated by means of an electric motor, not shown.

Figure 4:
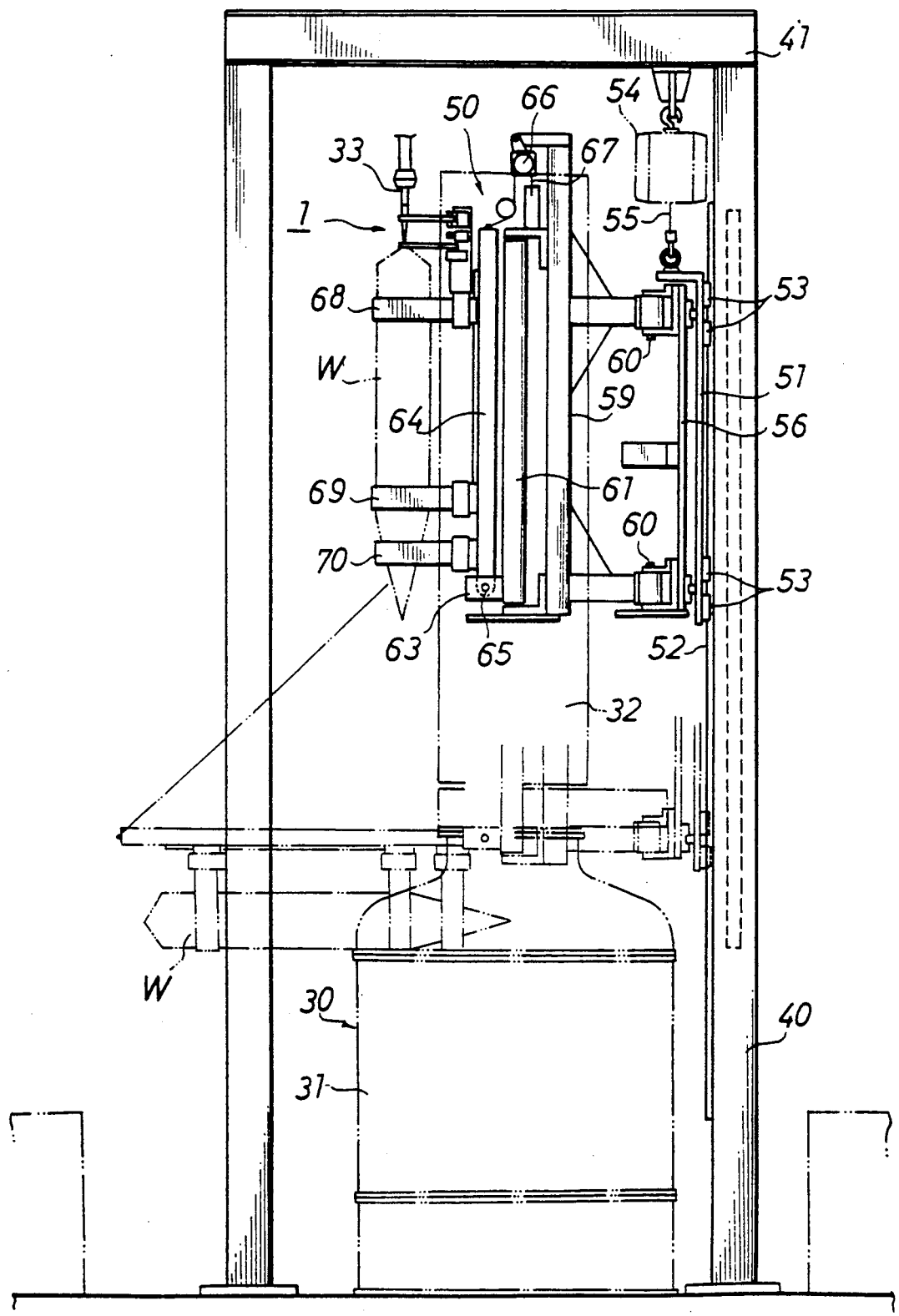
FIG. 4 is a side view of the single crystal pulling apparatus provided with the automatic disconnector.

The swing arm 64 is provided with an uppermost first chuck 68, a second chuck 69, and a lowermost third chuck 70: the first and second chucks 68, 69 are for chucking or holding the single crystal ingot W, as shown in FIG. 4, and the third chuck 70 is for centering the single crystal ingot W. Incidentally, these chucks 68, 69, 70 are adapted to open and close their arched arms by means of a threaded screw mechanism driven by an electric motor, not shown. In particular, the first chuck 68 is enabled to shift in the lengthwise direction of the swing arm 64 by means of a threaded screw mechanism driven by the electric motor, so that the chucks 68, 69 can appropriately hold the single crystal ingot W irrespective of the length thereof. The first and second chucks 68, 69 are each equipped with a sensor for detecting whether or not an ingot W is present and a torque limiter for preventing the arched arms from pressing too hard on the ingot W lest such an excessive force should damage the ingot W.

An automatic ingot disconnector 1 of the invention is integrally attached to the first chuck 68 in a manner such that the automatic ingot disconnector 1 is disposed above the chuck 68. As shown in detail in FIG. 1, the automatic ingot disconnector 1 comprises a neck clamper 2 for clamping the neck portion Wa of the pulled up single crystal ingot W, a monitor TV camera 3 installed below the neck clamper 2, and a neck nipper 4 provided at a location beneath the TV camera 3.

Figure 2:
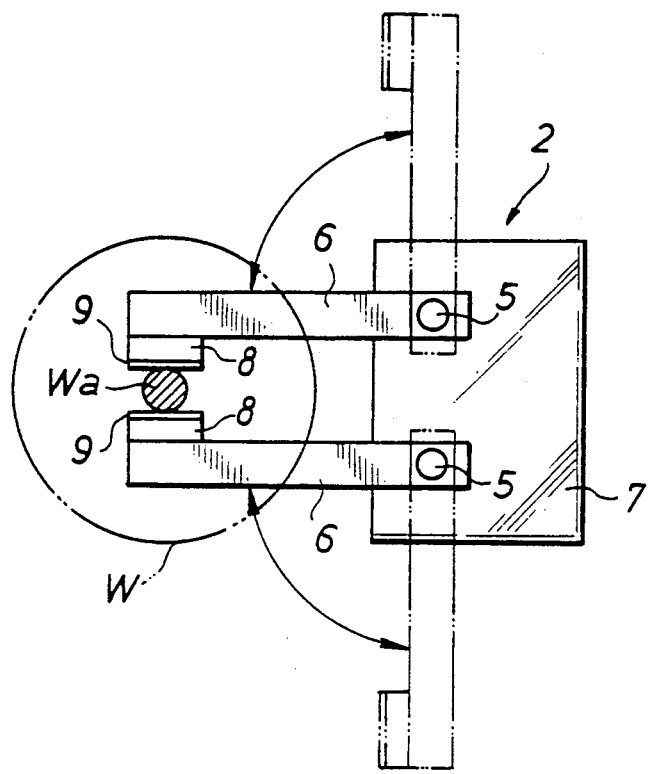
FIG. 2 is a cross-sectional view of the automatic single crystal ingot disconnector of FIG. 1 taken on the plane of the line II—II and seen from above.

The neck clamper 2, as shown in FIG. 2, consists of a pair of clamp fingers 6, 6 which swing horizontally about the respective vertical shafts 5, 5, on which they are pivoted, through an angle of about 90°, so that they assume open and closed positions. A clamp head 8 is welded onto the inner surface of each clamp finger 6 at the fore end thereof for clamping the neck portion Wa of the single crystal ingot W between them 8, 8, and that face of each clamp head 8 which gets in contact with the neck portion Wa of the ingot W is coated with a highly heat resistive Teflon plate 9. The neck clamper 2 further consists of an actuator 7 for driving the clamp fingers 6, 6, which actuator is remote-controlled by a control means, not shown.

The monitor TV camera 3 is provided so that the operator can observe the neck portion Wa of the single crystal ingot W by watching a monitor TV display set, not shown, installed at a place, such as an operation room, remote from the single crystal pulling apparatus 30.

Figure 3:
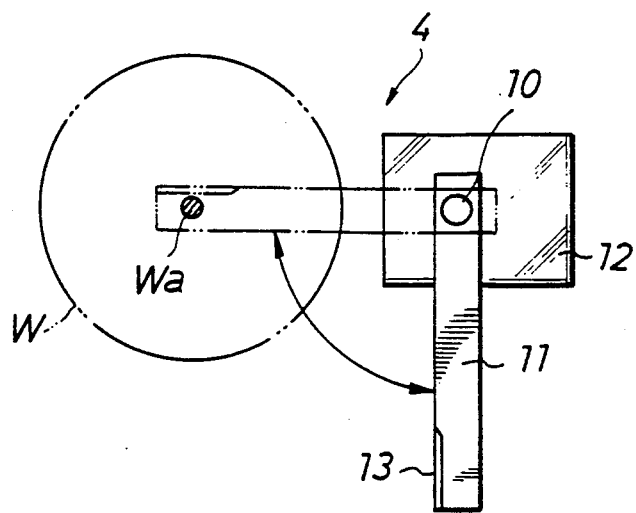
FIG. 3 is a cross-sectional view of the same apparatus of FIG. taken on the plane of the line III—III and seen from above.

The neck nipper 4, as shown in FIG. 3, is composed of a cutter 11 adapted to horizontally swing through an angle of about 90° about the shaft 10 on which it is pivoted; the fore end of the cutter 11 is formed with a sharp cut edge 13. The neck nipper 4 further comprises an actuator 12 for driving the cutter 11 to swing. The neck nipper 4 is remote-controlled by a control means, not shown, which gives operation commands to the actuator 12.

Incidentally, the TV camera 3 is fixed to stare at the point where the cut edge 13 of the neck nipper 4 would meet and cut through the neck of the ingot W.

Next, the manner in which the automatic ingot disconnector of the invention is operated will be described.

The single crystal ingot W pulled up in the single crystal pulling apparatus 30 is eventually housed in the crystal pull chamber 32, and the single crystal ingot removing assembly 50 is operated in a manner such that the swing arm 64 enters the pull chamber 32 by way of the access door, not shown, and grasps the single crystal ingot W with the first and the second chucks 68, 69. The third chuck 70 centers the ingot W so that the single crystal ingot W stays vertically. Then, the swing arm 64 is further operated to take the ingot W out of the pull chamber 32, as shown in FIG. 4. Thus, the ingot W is brought out from the single crystal pulling apparatus 30, and at this time the ingot W is still suspended by the wire, not shown, and the neck portion Wa is connected to the seed crystal 33.

Next, while observing the positions of the neck portion Wa of the ingot W and the neck nipper 4 by means of the monitor TV camera 3 and the monitor TV display set, not shown, the operator adjusts the vertical position of the first chuck 68 until the neck nipper 4 comes at the even height as the neck portion Wa where the diameter is the smallest (about 3 mm). Then, the actuator 7 of the neck clamper 2 is driven in a manner such that the clamp fingers 6, 6, which were assuming the open position (indicated by the two-dot chain line in FIG. 2), are caused to swing horizontally through an angle of about 90° about the shafts 5, 5 to assume the closed position, as indicated by the solid line in FIG. 2, whereupon the neck portion Wa of the single crystal ingot W is firmly clamped between the clamp heads 8, 8 of the clamp fingers 6, 6.

Thereafter, while observing the position of the neck portion Wa of the single crystal ingot W which is taken by the monitor TV camera 3 and reproduced on the monitor TV display set, not shown, the operator works the actuator 12 of the neck nipper 4 in a manner such that the cutter 11, which was assuming a position indicated by the solid line in FIG. 3, is caused to swing horizontally through an angle of about 90° about the vertical shaft 10 to assume a position, as shown by the two-dot chain line in FIG. 3, whereupon the sharp cut edge 13 of the cutter 11 hits the single crystal ingot W applying the shear force to the neck portion Wa where the diameter is the smallest; as a consequence, the fragile neck portion Wa is easily severed and the single crystal ingot W is disconnected at the neck portion Wa from the seed crystal 33 and the wire, not shown, to which the seed crystal 33 is attached.

After this, the electric chain block 66 is driven to uncoil the chain 67 until the swing arm 64 turns down about the shaft 65 and assumes a horizontal posture whereby the single crystal ingot W is also turned down and poses horizontally; then, the chain block 54 is driven to uncoil the chain 55 to lower the single crystal ingot removing assembly 50, as indicated by two-dot chain line in FIG. 4. Finally, the ingot W is placed on a platform car, not shown, and carried away by it.

As described above, according to this embodiment of the invention, the neck portion Wa of the grown single crystal ingot W is automatically cut through by the automatic ingot disconnector 1, which is remote-controlled, so that it is possible to do away with the dangerous task of ingot removing formerly conducted manually by the operator.

Also, since the operation of nipping the neck portion Wa of the single crystal ingot W is automatized, it became possible to fully automatize the total operation of the single crystal pulling apparatus 30, that is, to automatically conduct the complete operation series starting with charging of the polycrystal substance and ending with removal of the single crystal ingot after it is pulled up.

EFFECTS OF THE INVENTION

As is clearly explained in the above description, according to the invention, the automatic single crystal ingot disconnector 1 is incorporated in a single crystal ingot removing assembly 50 used with the single crystal pulling apparatus 30, and particularly attached to the uppermost first chuck 68, and is, therefore, capable of being displaced in the axial direction of the ingot W when the ingot W is chucked and centered by the chucks 69 and 70; or, as is claimed later, the automatic single crystal ingot disconnector 1 is mounted fixedly on the uppermost chuck assembly 68, which chuck assembly 68 is adapted to shift in the axial direction of the ingot W being chucked, and is constructed to include the neck clamper means 2 for clamping the neck portion Wa of the single crystal ingot W, a monitor TV camera 3 installed below the neck clamper means 2, and a neck nipper means 4 provided at a location beneath the TV camera 3; so that it is now possible to disconnect the grown single crystal ingot at the neck automatically and by remote controlling. Consequently, the operation of the single crystal pulling apparatus includes no dangerous manual task and is in condition to be fully automatized.

As many apparently widely different embodiments of this invention may be made without departing from the spirit and scope thereof, it is to be understood that the invention is not limited to the specific embodiment thereof except as defined in the appended claims. For example, in place of the cutter 11, a laser beam cutter device may be employed to sever the neck portion of the ingot.

What is claimed is:

1. An automatic single crystal ingot disconnector which is mounted on the uppermost chuck assembly of a single crystal ingot removing assembly adapted to hold a grown single crystal ingot, which uppermost chuck assembly is adapted to shift in the axial direction of said ingot being chucked in response to remote controlling; said automatic single crystal ingot disconnector being characterized by comprising a neck clamper means for clamping an upper part of the neck portion of said ingot, a neck cutter means located below said neck clamper means, for cutting through the neck portion of said ingot at a part lower than said upper part to thereby disconnect said single crystal ingot from a seed crystal to which said ingot is connected, and a monitor means for visually monitoring a position where said neck cutter means applies a cutting operation on the neck portion of the single crystal ingot.

2. The automatic single crystal ingot disconnector as claimed in claim 1 wherein said neck clamper means comprises two clamp fingers which cooperate to assume an open position and a clamping position by horizontally swinging through an angle of about 90°, and an actuator means for driving said clamp fingers in response to remote controlling.

3. The automatic single crystal ingot disconnector as claimed in claim 1 wherein said neck cutter means comprises a cutter blade adapted to swing horizontally through an angle of about 90° and an actuator means for driving said cutter blade in response to remote controlling.

4. The automatic single crystal ingot disconnector as claimed in claim 1 wherein said monitor means comprises a TV camera adapted to view the position where said neck cutter means applies a cutting operation on the neck of the single crystal ingot, and a viewing screen located at a remote place from the single crystal ingot disconnector for reproducing the picture of the scene viewed by said TV camera.

5. The automatic single crystal ingot disconnector as claimed in claim 4 wherein said TV camera is located below said neck clamper means and above said neck cutter means.

* * * * *